United States Patent [19]
Landolt

[11] Patent Number: 6,060,934
[45] Date of Patent: May 9, 2000

[54] CELL INCLUDING A PSEUDO-CAPACITOR, IN PARTICULAR FOR AN ARTIFICIAL RETINA

[75] Inventor: Olivier Landolt, Neuchatel, Switzerland

[73] Assignee: C.S.E.M. Centre Swiss d'Electronique et de Microtechnique S.A., Neuchatel, Switzerland

[21] Appl. No.: 09/189,707

[22] Filed: Nov. 11, 1998

[30] Foreign Application Priority Data

Nov. 12, 1997 [FR] France .................................. 97 14165

[51] Int. Cl.[7] .......................................................... G06G 7/64
[52] U.S. Cl. .............................................. 327/334; 327/91
[58] Field of Search .................................... 327/334, 335, 327/91, 581, 105

[56] References Cited

U.S. PATENT DOCUMENTS

| | | | |
|---|---|---|---|
| 3,849,767 | 11/1974 | Shirato | 327/589 |
| 3,922,650 | 11/1975 | Schaffer | 327/581 |
| 5,349,245 | 9/1994 | Hughes et al. | 327/91 |

OTHER PUBLICATIONS

"Linear Networks Based on Transistors", E.A. Vittoz and X. Arreguit, Electronic Letters, vol. 29, No. 3 (Feb. 4, 1993).

Primary Examiner—Toan Tran

[57] ABSTRACT

A cell incorporated in an integrated circuit and having an input node behaves as a capacitor vis-a-vis the relation between the current entering the input node and the pseudo-voltage at the input node. The cell comprises a variable pseudo-conductance, including a control terminal, connected between the input node and a node, the pseudo-voltage of which is zero (pseudo-ground) and a differentiator having an input connected to the input node and an output connected to the control terminal of the variable pseudo-conductance to control them in accordance with the voltage at the input node. Applications include a photo-sensitive array forming an artificial retina.

8 Claims, 4 Drawing Sheets

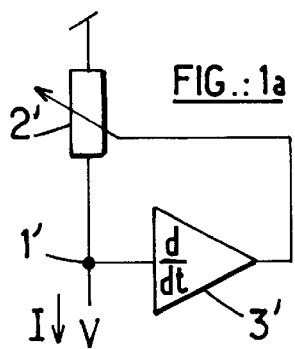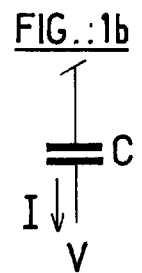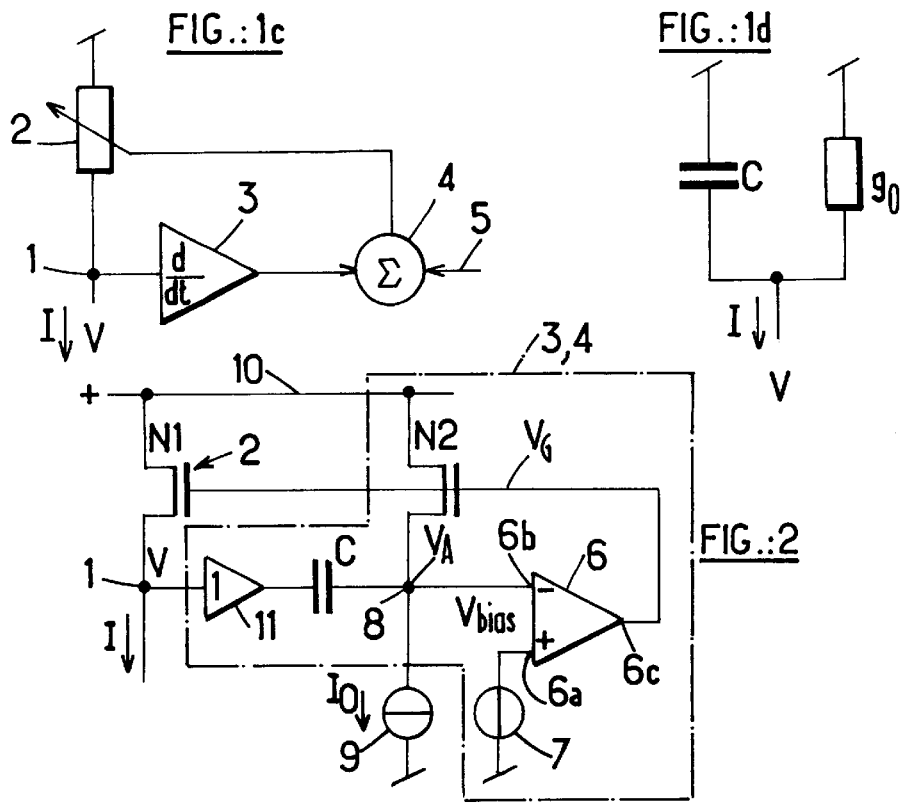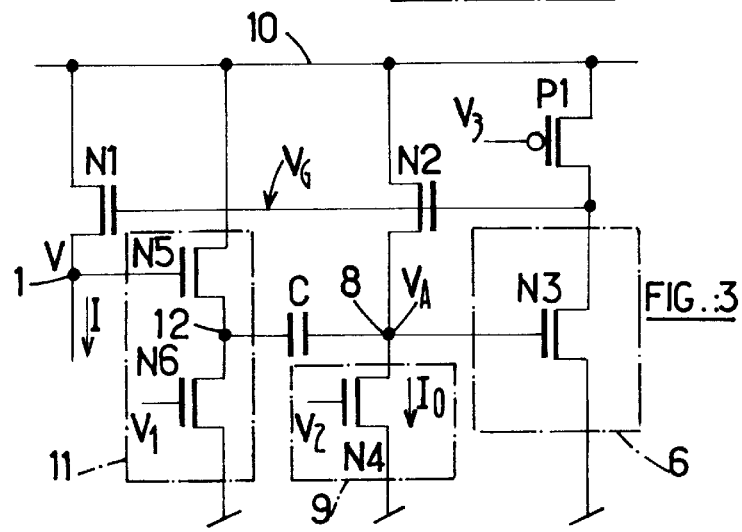

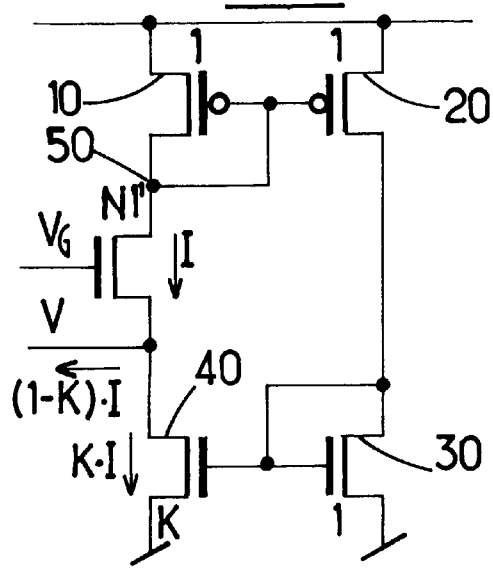
FIG.:4
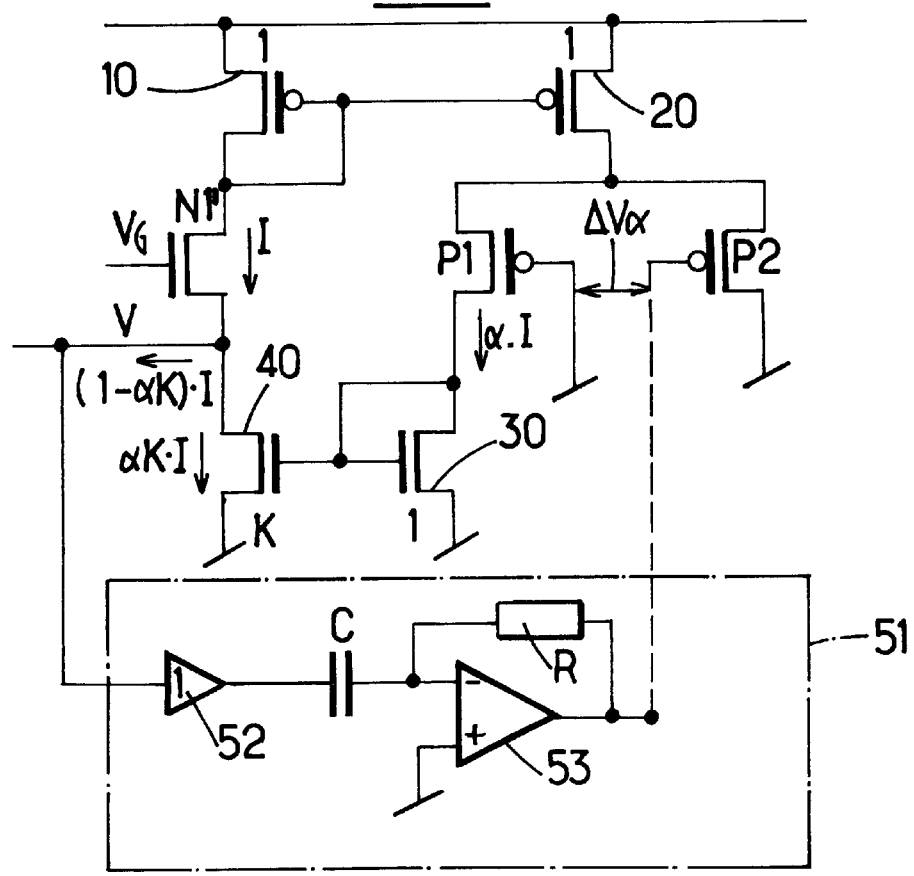
FIG.:5

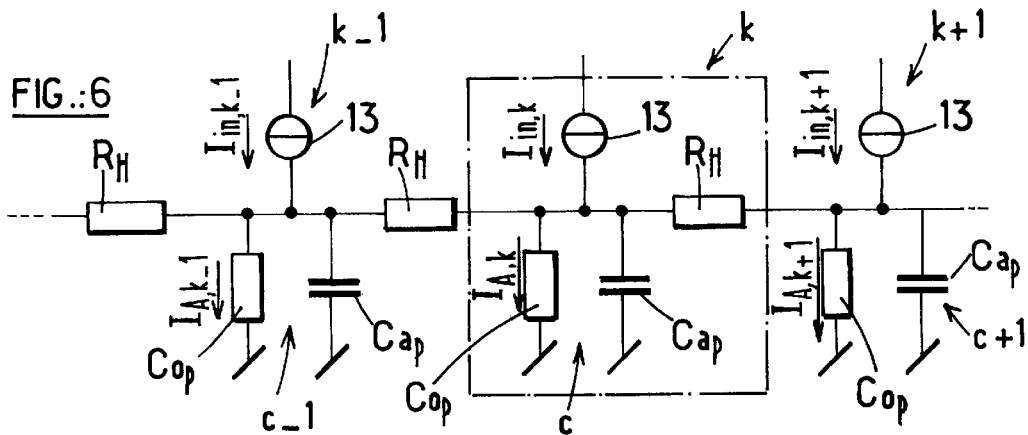
FIG.:6
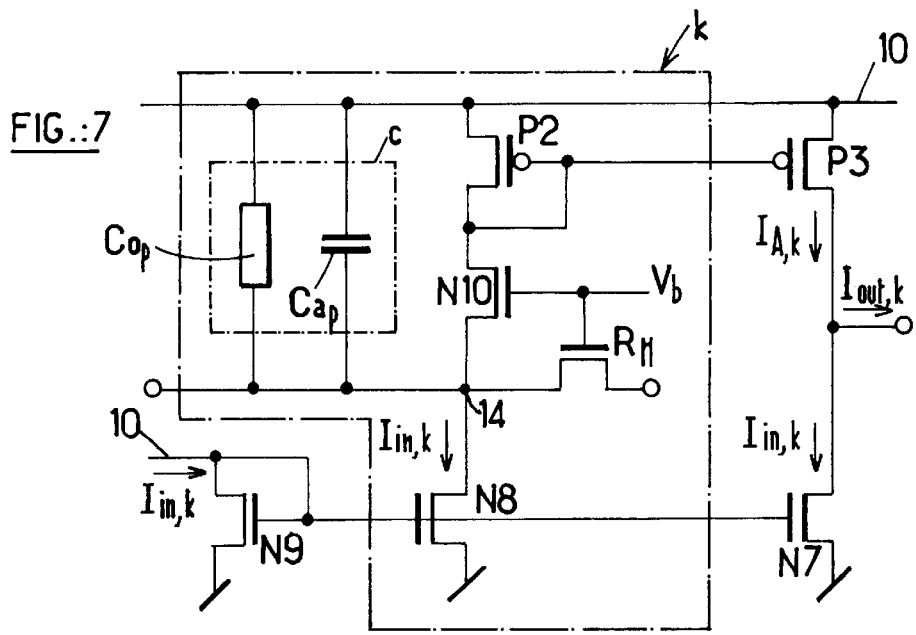
FIG.:7
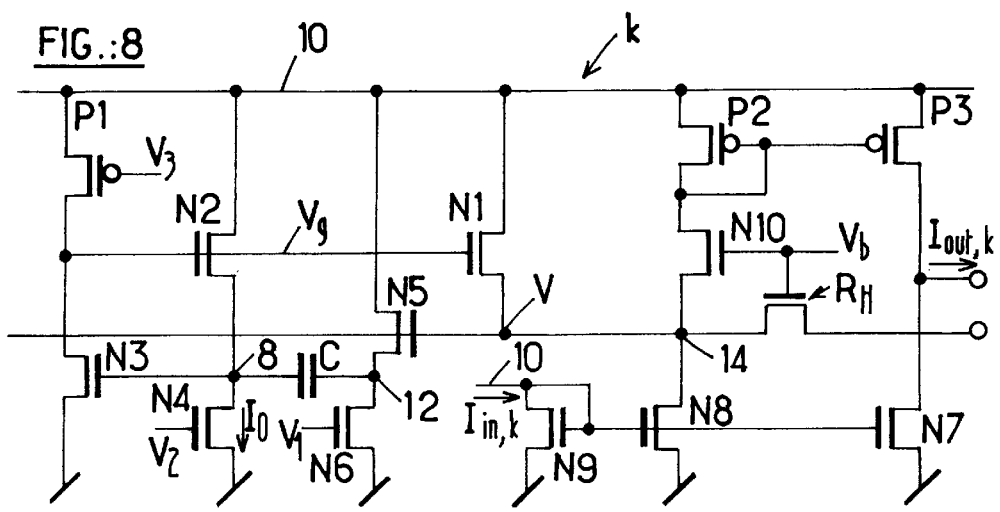
FIG.:8

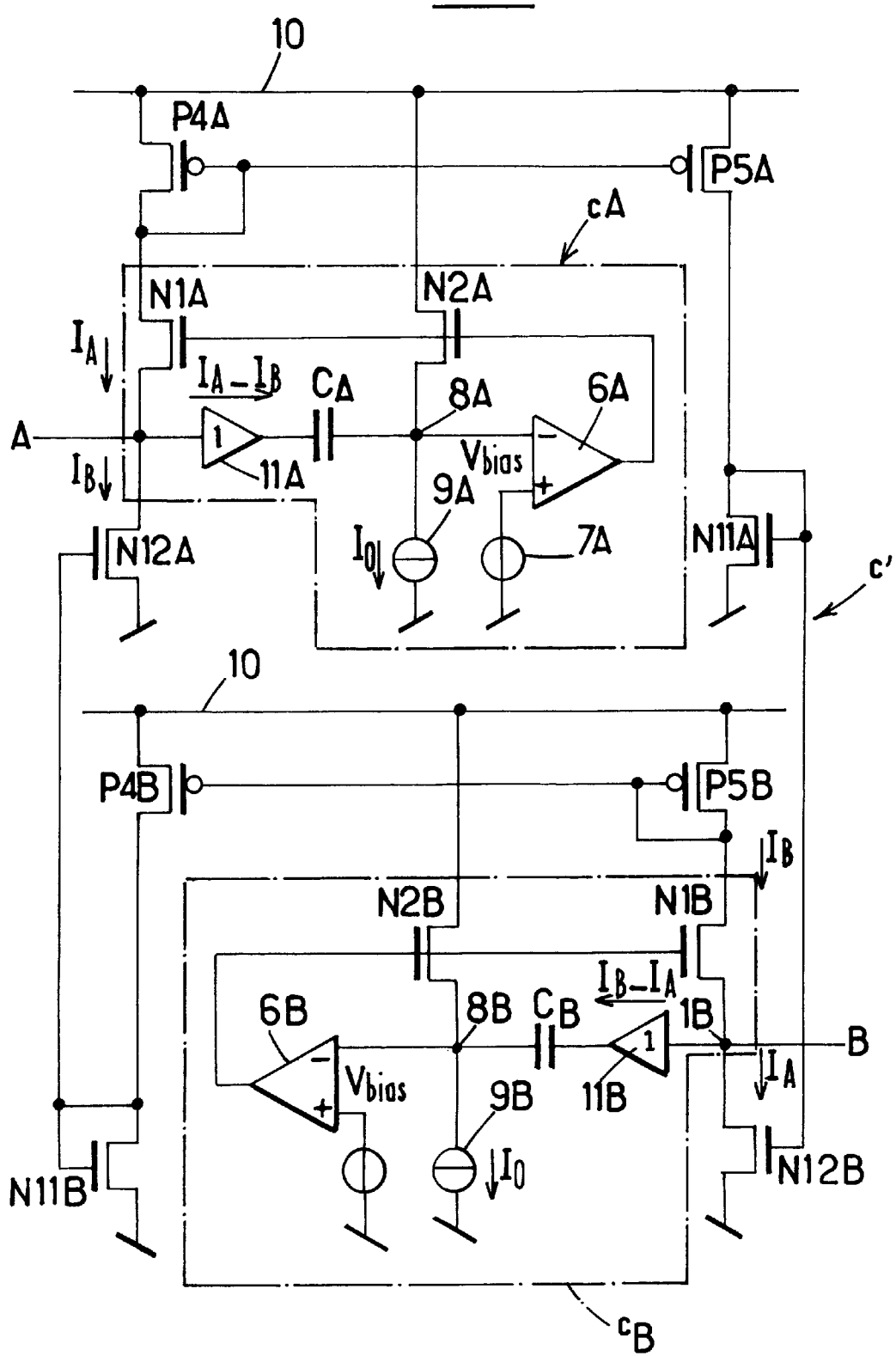
FIG.:9

CELL INCLUDING A PSEUDO-CAPACITOR, IN PARTICULAR FOR AN ARTIFICIAL RETINA

BACKGROUND OF THE INVENTION

1. Field of the invention

The present invention concerns a cell behaving like a linear capacitor when embedded in a network of MOS transistors exploited as linear pseudo-conductances.

1. Description of the prior art

In many applications of integrated circuits, and in particular of those using the CMOS technology, it may be beneficial to integrate resistive and capacitive components showing linear behavior. One particular application of this kind, to which the invention is by no means limited, is that of circuits used in artificial retinas for detecting contrasts and more particularly the edge contrasts of an object being examined.

In an article published in "Electronic Letters" of Feb. 4, 1993, Vol. 29, N°3, pages 297 and 298, E. A. Vittoz and X. Arreguit describe a technique for synthesizing CMOS technology analog circuits to create linear resistive arrays that are made up exclusively of CMOS transistors and that are remarkable compact. Linear resistive circuits of the above kind can be used in digital/analog converters, current mode spatial filters, in particular for analyzing images captured by an artificial retina and other analogous circuit systems.

These linear resistive arrays are based on the following considerations.

The channel current of an MOS transistor biased in weak inversion (subthreshold regime) can be defined by the following equation:

$$I_{ds} = g^* \cdot (V_d^* - V_s^*) \quad (1)$$

where $g^*$ is defined as follows:

$$g^* = \frac{I_S}{V_O} \cdot \exp\left(\frac{V_G - V_{TO}}{nU_T}\right) \quad (2)$$

and $V_d^*$ and $V_s^*$ are the transforms of the drain voltage $V_d$ and the source voltage $V_s$ in accordance with the function:

$$V^* = -V_o \cdot \exp\left(\frac{-V}{U_T}\right) \quad (3)$$

Hereinafter $g^*$ will be called the "pseudo-conductance" and $V^*$ will be called the "pseudo-voltages".

The following terms are used in the above equations.

| | |
|---|---|
| $I_{ds}$ | transistor source-drain current; |
| $g^*$ | transistor pseudo-conductance; |
| $V_d^*$ | drain pseudo-voltage relative to local substrate (substrate or well) |
| $V_s^*$ | source pseudo-voltage relative to local substrate (substrate or well); |
| $I_S$ | specific current proportional to a ratio between the width and the length of the transistor; |
| $V_O$ | arbitrary scaling voltage; |
| $V_G$ | transistor gate voltage relative to the local substrate (substrate or well); |
| $V_{TO}$ | transistor threshold voltage; |
| n | slope factor; |
| $U_T$ | thermodynamic potential; and |
| $V^*$ | pseudo-voltage of the node materialized by a transistor terminal (its source or its drain). |

For more details of the above synthesis technique reference may be made to the article mentioned above, what it is essential to retain being that, as can be seen from equation (1) above, the behavior of the transistor can be analyzed using a pseudo-Ohms law, $g^*$ characterizing the pseudo-conductance of the transistor. It can also be seen that the technique in question can simplify and optimize the design and the topology of a resistive array formed of MOS transistors.

A drawback that until now has limited the use of integrated circuits based on the above analysis technique is the impossibility of associating capacitors with the resistive circuits. As the voltages are converted into pseudo-voltages, a linear capacitor in the ordinary voltage domain no longer behaves as such in the pseudo-voltage domain.

It would be desirable to have cells in the integrated circuits forming pseudo-capacitive components, for example of the C or RC type, the design of which would be suited to synthesis using pseudo-voltages, such cells enabling implementation of filters combining the spatial function with the temporal function, the latter being implemented using pseudo-capacitive components.

The aim of the invention is to provide an integrated circuit cell including a pseudo-capacitor showing linear behavior in the pseudo-voltage domain.

SUMMARY OF THE INVENTION

In one aspect the invention consists in a cell adapted to be incorporated into an integrated circuit and having an input node, said cell behaving as a capacitor vis-a-vis the relation between the current entering the input node and the pseudo-voltage thereat, said cell comprising adjustable pseudo-conductance means, including a control terminal, connected between said input node and pseudo-ground (i.e. a node, the pseudo-voltage of which is zero) and differentiating means having an input connected to said input node and an output connected to said control terminal of said adjustable pseudo-conductance means to control them in accordance with the voltage at said input node.

In another aspect the invention consists in a cell as defined hereinabove behaving as a pseudo-capacitor shunting a pseudo-conductance.

The invention also consists in an application of the cell as just described in a photo-sensitive array forming an artificial retina.

Other features and advantages of the invention will become apparent in the course of the following description given by way of example only and with reference to the accompanying drawings.

BRIEF DESCRIPTION OF THE DRAWINGS

FIG. 1a is a diagram showing the functions needed to implement a pseudo-capacitive cell in accordance with the invention.

FIG. 1b is the equivalent circuit for FIG. 1a in the ordinary voltage domain.

FIG. 1c is a diagram of a cell providing a pseudo-capacitor shunting a pseudo-conductance.

FIG. 1d is the equivalent circuit for FIG. 1c in the ordinary voltage domain.

FIG. 2 is a slightly more detailed diagram of the cell from FIG. 1c.

FIG. 3 shows one practical embodiment of the cell from FIG. 2.

FIG. 4 shows a circuit having the characteristics of a grounded negative pseudo-conductance.

FIG. 5 is a diagram of a variable pseudo-capacitor.

FIG. 6 is an equivalent diagram of three adjacent "pixels" of a one-dimensional array arrangement for use in an artificial retina with spatio-temporal filtering, each pixel comprising one cell in accordance with the invention.

FIG. 7 is a more detailed diagram of one pixel from the FIG. 6 arrangement.

FIG. 8 is a detailed diagram of one embodiment of a pixel of the above kind.

FIG. 9 is a simplified diagram of a cell in accordance with the invention in which the pseudo-capacitor is "floating", i.e. not connected to ground.

Reference will first be made to FIGS. 1a through 1d which are simplified diagrams of a pseudo-capacitive cell in accordance with the invention and with the aid of which the basic principle of the invention will now be explained.

Assume that a current I is injected at a voltage V into a node 1 (FIG. 1c) or a node 1' (FIG. 1a). Differentiating equation (3) above with respect to time yields:

$$\dot{V}^* = -V^* \frac{\dot{V}}{U_T} \quad (4)$$

If the current I must depend also on a pseudo-capacitive behavior, the following equation must be satisfied:

$$I = -C^* \cdot \dot{V}^* \quad (5)$$

On other words:

$$I = +C^* V^* \frac{\dot{V}}{U_T} \quad (6)$$

The above equation can be satisfied by using a conductance g* satisfying the following equation:

$$g^* = -C^* \frac{\dot{V}}{U_T} \quad (7)$$

where in this case g* constitutes a factor of proportionality depending on the derivative of the voltage V.

In accordance with the basic principle of the invention the equation can be applied if a pseudo-conductance 2 (or 2') can be used whose value can be varied, by means of a control terminal, in accordance with the output of means 3 (or 3') for differentiating the voltage V with respect to time, the input of the differentiating means being connected to the node 1 (or 1'), as shown here.

Depending on whether the potential at the node 1 (or 1') is increasing or decreasing, the pseudo-conductance 2 (or 2') is positive or negative. A positive pseudo-conductance can be achieved with a single transistor, but a negative pseudo-conductance requires a combination of several transistors. It may be preferable to ensure that the pseudo-conductance 2 always remains positive. A variant of the circuit (see FIG. 1c) is obtained by adding an adder 4 whose function is to add to the output of the differentiating means 3 a constant value applied to a terminal 5. With an adder of the above kind, the equation characterizing the value of the pseudo-conductance 2 becomes:

$$g^* = g_o^* - C^* \left( \frac{\dot{V}}{U_T} \right) \quad (8)$$

where $g_o^*$ designates the constant value referred to above. The pseudo-conductance g* remains positive provided that the time differential of V satisfies the following condition:

$$\dot{V} < \frac{g_0^*}{C^*} U_T \quad (9)$$

The constant $g_0^*$ must preferably be chosen so that condition (9) is always satisfied in the intended operating conditions of the circuit. In the presence of the adder the relation between the pseudo-voltage at the input node 1 and the current flowing through the pseudo-conductance 2 becomes:

$$I = -g^* \cdot V^* = -g_0^* \cdot V^* - C^* \cdot \dot{V}^* \quad (10)$$

For a circuit comprising a linear capacitor C shunting a linear conductance $g_0$ (see FIG. 1d) the relation between the voltage V at its terminals and the current I flowing through it is:

$$I = -g_0 \cdot V - C \cdot \dot{V} \quad (11)$$

Comparing the previous two equations, it can be seen that the circuit from FIG. 1c behaves in exactly the same way as the combination of a capacitor and a linear conductance, except that ordinary voltages are replaced by pseudo-voltages. In the particular case in which the additive constant $g_0^*$ is zero, the circuit behaves like a capacitor only. However, this choice of $g_0^*$ is not always desirable, for the reasons given above.

FIG. 2 is a slightly more detailed diagram showing how the functions illustrated in FIG. 1c can be implemented.

The transistor N1 constitutes the pseudo-conductance 2 of FIG. 1c and the circuitry inside the chain-dotted frame forms the differentiating means 3 and the adder 4. The differentiating means comprise an operational amplifier 6 a non-inverting input 6a of which is connected to a supply 7 providing a constant voltage $V_{bias}$. The inverting input 6b of the amplifier 6 is connected to a node 8 at which there is a constant voltage $V_A$ equal to the voltage $V_{bias}$.

The node 8 is connected:

- to a current supply 9 providing the current $I_0$;
- to a capacitor C of predetermined value integrated into the circuit; and
- to the source of a transistor N2 the gate of which, at voltage $V_G$, is connected to the output 6c of the operational amplifier 6.

The source of the transistor N1 is connected to the input node 1 and its gate is connected to that of the transistor N2. The drains of the transistors N1 and N2 are connected to a positive supply rail 10.

The capacitor C is connected to the node 1 by a voltage follower 11 which prevents the current flowing in the capacitor C from flowing towards the input node 1. Note that the transistors N1 and N2 operate in weak inversion, which means that for a given geometry of the transistors the current flowing through them must not exceed a predetermined limit.

Note also that in the example shown the transistors are of the N type but a circuit using P type transistors would be equally feasible.

The FIG. 2 circuit operates in the following manner.

The amplifier 6 controls the gate voltage $V_G$ of the transistor N2 so that the potential $V_A$ at its input 6b remains constant and equal to the constant potential $V_{bias}$. In the presence of variations in the input potential V of the circuit, the channel current of the transistor N2 is equal to $$I_{N2} = {}_0 - C \cdot \dot{V}$$

Because the source of the transistor N2 is maintained at a constant pseudo-potential $V^*_{bias}$ and because the pseudo-potential at the drain of the transistor N2 is zero (this transistor is saturated), the pseudo-conductance of the transistor N2 is equal to $$g^*_{N2} = \frac{I_0 - C \cdot \dot{V}}{-V^*_{bias}} \tag{13}$$

The two transistors N1 and N2 having the same gate potential and the same geometry, the pseudo-conductances that they form are equal. Consequently, the relation between the input pseudo-potential and the input current can be written:

$$I = -g^*_{N1} \cdot V^* = \frac{I_0}{V^*_{bias}} \cdot V^* - \frac{C \cdot \dot{V}}{V^*_{bias}} \cdot V^* \tag{14}$$

From equation (4):

$$\dot{V} = -U_T \frac{\dot{V}^*}{V^*} \tag{15}$$

Furthermore, the following auxiliary variables can be defined:

$$g^*_0 = \frac{-I_0}{V^*_{bias}} \tag{16}$$

$$C^* = \frac{-C \cdot U_T}{V^*_{bias}} \tag{17}$$

By substituting (15), (16) and (17) in equation (14), equation (18) is obtained relating the input current I, the pseudo-potential V1 at the node 1 and the time derivative of the latter:

$$I = -g^*_0 \cdot V^* - C^* \cdot \dot{V}^* \tag{18}$$

The latter equation is of the same form as the equation relating the current and the voltage of a conductance connected to ground shunting a capacitor. Thus it can be seen that the FIG. 2 circuit enables the objective of the invention to be achieved, namely the creation of a linear capacitance in the pseudo-voltage domain.

FIG. 3 shows one concrete embodiment of the cell in accordance with the invention. The function of the amplifier 6 from FIG. 2 is implemented by a transistor 3 whose channel is connected in series with the channel of a transistor P1 connected to the power supply rail 10. The transistor P1 constitutes an active load for the transistor N3 and its gate receives a bias voltage $V_3$. The current supply 9 consists of a transistor N4 to whose gate a bias voltage $V_2$ is applied. The voltage follower 11 consists of two transistors N5 and N6 in series, their common node 12 being connected to the capacitor C. The gate of the transistor N5 is connected to the input node 1 and the gate of the transistor N6 receives a bias voltage $V_1$.

The voltage $V_3$ applied to the gate of the transistor P1 determines the potential $V_A$ of the node 8 that constitutes a virtual ground. The circuit operates provided that the current in the capacitor C does not exceed the current $I_0$ if the potential V increases rapidly with time.

Note that the voltage follower 11 is not necessary if the circuit is operated under conditions in which the current flowing in the capacitor C remains well below the channel current of the transistor N1. This condition amounts to defining a minimal ratio between the direct components of the currents I and $I_0$.

It has previously been shown that although a positive pseudo-conductance could be implemented by means of a single transistor, a negative pseudo-conductance requires a combination of transistors. FIG. 4 shows a negative pseudo-conductance of the above kind. The transistor N1' can be considered as a normal (positive value) pseudo-conductance connected between the input node at potential V and the pseudo-ground 50 provided that the potential at node 60 is sufficiently high to keep transistor N1' saturated. Its pseudo-conductance $g^*$ is determined by the constant potential $V_G$ applied to its gate. The current I flowing through N1' varies linearly with the pseudo-potential $V^*$. This current is amplified by a factor K by two current mirrors consisting of the pairs of identical transistors 10–20 and 30–40 and then subtracted from the current I. The net input current is therefore $(1-K) \cdot g^* \cdot V^*$. The behavior of the circuit is equivalent to that of a negative pseudo-conductance connected to ground if K is greater than 1.

The FIG. 4 circuit is of real practical benefit if it can be rendered continuously variable, for example, by adding means for varying the amplification factor of the loop. One possibility is shown in FIG. 5. The differential pair of P type transistors P1 and P2 samples a fraction $\alpha$ of the current I (with $0 \leq \alpha \leq 1$) before amplification by the factor K.

The net gain is $\alpha K$ which can be varied by the voltage $\Delta V_\alpha$ applied between the gates of the transistors P1 and P2. Again, if the net gain is greater than 1, the equivalent pseudo-conductance will be negative. For example, if K=2 the pseudo-conductance can be varied from $-g^*$ to $+g^*$. The diagram can be completed by the part in the chain-dotted box 51 to produce a pseudo-capacitive cell in accordance with the invention. The input node at voltage V is connected via a voltage follower 52 to a capacitor C. The other side of the capacitor is connected to the inverting input of an operational amplifier 53 configured as a current to voltage converter and the output of which supplies the voltage $\Delta V_\alpha$ controlling the gates of the transistors P1 and P2.

FIG. 6 shows one example of an application of a cell in accordance with the invention to a spatiotemporal filter to be used in an artificial retina. For simplicity, the example applies to a unidimensional array, a description of which can be found in an article by William H. A. Beaudot entitled "Adaptive Spatiotemporal Filtering by a Neuromorphic Model of the Vertebrate Retina" published in IEEE, Proceedings of the 1996 International Conference on Image Processing, Sept. 1996, Lausanne.

FIG. 6 represents only three pixels k−1, k and k+1 of the array, each pixel including a current source 13 supplying the input current $I_{in}$ of the pixel and a respective cell c−1, c and c+1 in accordance with the invention, of the type shown in FIG. 1c. The pixels are connected together by horizontal resistive components $R_H$.

FIG. 7 is a simplified diagram of the pixel k of the array from FIG. 6, the cell here being represented only by its equivalent circuit which represents a pseudo-conductance $Co_p$ shunting a pseudo-capacitor $Ca_p$.

The circuit includes a transistor N7 in which flows a current $I_{in}$ representative of the light captured by the pixel k from the scene observed. The transistor N7 is configured as a current mirror with a transistor N8 controlled by a transistor N9 through which the current $I_{in}$ flows. The pixel also includes a vertical resistive component formed by a transistor N10 whose channel is connected to the channel of the transistor N8 by a node 14. The latter node is also connected to a horizontal conductance $R_H$ formed by another transistor the gate of which receives a bias voltage $V_b$, also received by the gate of the transistor N10.

The vertical resistor consisting of the transistor N10 shunts the cell c. It behaves as a pseudo-conductance connected to a pseudo-ground (the node common to the transistors P2 and N10). The current IA flowing through it is proportional to the pseudo-potential of the node 14 and therefore proportional to the current flowing in the pseudo-conductance $Co_p$ of the cell c, to which current there is no direct access. This current flows in the channel of a transistor P2 that forms a current mirror with another transistor P3. The channel of the transistor P3 therefore carries the current $I_A$ and is connected to the channel of the transistor N7, the output current $I_{out}$ being the difference between the current $I_{in}$ and the current $I_A$. The node between the channels of the transistors N7 and P3 constitutes the output of the pixel k.

The pixel k is connected to its neighbor k−1 by the node 14 and to its neighbor k+1 by the transistor $R_H$.

Because of the presence of the cell c in accordance with the invention, the output signal of the pixel k can represent a static component and a temporal component reflecting local variations in light as a function of time in the scene observed by the array forming the artificial retina. The array can therefore constitute a spatio-temporal filter in this specific application.

FIG. 8 is a detailed diagram of the pixel )<, the cell c being shown in full as in the FIG. 3 diagram.

In the foregoing description the cell in accordance with the invention is described as constituting the parallel combination of a pseudo-conductance and a pseudo-capacitor one end of which is connected to ground.

In some applications it may be desirable to have a floating pseudo-capacitor. FIG. 9 shows one possibility of implementing a floating pseudo-capacitor using the same concept as previously described for the pseudo-capacitor connected at one end to ground.

The equivalent circuit of the arrangement shown in FIG. 9 comprises two pseudo-conductances connected to ground at one end, their other end being connected to respective ends of a pseudo-capacitor.

The cell c' forming a floating pseudo-capacitor is made up of two identical cells cA and cB conforming to the cell c previously described. The input nodes 1A and 1B of the respective cells cA and cB of a set of transistors form current mirrors so that respective currents $I_{A-IB}$ and $I_B-I_A$ flow in the two pseudo-conductances of the cells cA and cB. The current mirrors are formed by the transistors N11A, N11B, N12A, N12B and P4A, P4B, P5A, P5B, connected as shown in FIG. 9.

Note that in all the diagrams previously described the conductivity types of the transistors can be reversed to form circuits with functions equivalent to those described, the modifications and adaptations necessary for this being evident to the skilled person after reading the present description. What is more, the present invention also finds an application in bipolar technologies.

There is claimed:

1. A cell adapted to be incorporated into an integrated circuit and having an input node, said cell behaving as a capacitor vis-a-vis the relation between the current entering said input node and the pseudo-voltage thereat, said cell comprising variable pseudo-conductance means, including a control terminal, connected between said input node and pseudo-ground and differentiating means having an input connected to said input node and an output connected to said control terminal of said variable pseudo-conductance means to control them in accordance with the voltage at said input node.

2. A cell as claimed in claim 1 wherein an adder is inserted between said control terminal of said variable pseudo-conductance means and said output of said differentiating means and is adapted to add to the output signal of said differentiating means a constant value representing a maximal value that said output signal can assume.

3. The cell claimed in claim 1 wherein said variable pseudo-conductance means comprise an MOS transistor having a gate connected to the output of said differentiating means.

4. The cell claimed in claim 1 wherein said differentiating means include an operational amplifier having a non-inverting input connected to a constant voltage supply and an inverting input connected to an intermediate node which is adapted to be maintained at a constant voltage, said intermediate node being further connected to a capacitor connected to said input node, said operational amplifier having an output connected to said control terminal of said variable pseudo-conductance means.

5. A cell as claimed in claim 4 including a voltage follower connected between said input node and said capacitor to prevent the current flowing in said capacitor reaching said input node.

6. A cell as claimed in claim 1 wherein said variable pseudo-conductance means comprise an MOS transistor carrying a current I and having a gate maintained at a fixed potential, subtractor means are provided for subtracting from said input node a current $\alpha K.I$ where K represents a fixed amplification factor and $\alpha$ is a coefficient variable in the range 0 to 1, and the output of said differentiating means is used to generate said variable coefficient $\alpha$.

7. The cell claimed in claim 6 wherein said subtractor means comprise a first current mirror adapted to copy said current I flowing through said MOS transistor, a differential amplifier adapted to deliver a current $\alpha.I$ from said copy in response to a control voltage and a second current mirror connected to said input node and making an amplified copy of said current, and said differentiating means comprise in series a voltage follower, a capacitor and a follower amplifier the output voltage of which represents said control voltage.

8. An application of the cell claimed in claim 1 to a photo-sensitive array forming an artificial retina.

* * * * *